United States Patent
Hoefnagels et al.

(10) Patent No.: US 7,116,398 B2
(45) Date of Patent: Oct. 3, 2006

(54) LITHOGRAPHIC APPARATUS AND DEVICE MANUFACTURING METHOD

(75) Inventors: Johan Christiaan Gerard Hoefnagels, Hooge Mierde (NL); Peter Spit, Hong Kong (CN)

(73) Assignee: ASML Netherlands B.V., Veldhoven (NL)

(*) Notice: Subject to any disclaimer, the term of this patent is extended or adjusted under 35 U.S.C. 154(b) by 30 days.

(21) Appl. No.: 10/972,784

(22) Filed: Oct. 26, 2004

(65) Prior Publication Data

US 2005/0145805 A1 Jul. 7, 2005

(30) Foreign Application Priority Data

Nov. 7, 2003 (EP) .................................. 03257062

(51) Int. Cl.
G03B 27/68 (2006.01)
G03B 27/42 (2006.01)
G03B 27/32 (2006.01)
G02F 1/1335 (2006.01)
G03C 5/00 (2006.01)

(52) U.S. Cl. .................. 355/52; 355/53; 355/77; 349/4; 430/30

(58) Field of Classification Search .................. 355/20, 355/52, 53, 77, 237.2, 237.3, 237.4, 237.5; 430/22, 30; 250/492.22; 349/2, 4, 106
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B1 | 9/2004 | Tanaka et al. | |
| 6,806,897 B1 | 10/2004 | Kataoka et al. | |
| 6,811,953 B1 | 11/2004 | Hatada et al. | |
| 2003/0124868 A1 | 7/2003 | Mizukoshi | |
| 2004/0027549 A1* | 2/2004 | Nagayama | 355/55 |
| 2004/0041104 A1 | 3/2004 | Liebregts et al. | |

(Continued)

FOREIGN PATENT DOCUMENTS

JP 03201423 9/1991

(Continued)

OTHER PUBLICATIONS

English translation of Japanese Patent document JP 07-295229.*

(Continued)

*Primary Examiner*—Alan Mathews
(74) *Attorney, Agent, or Firm*—Sterne, Kessler, Goldstein & Fox P.L.L.C.

(57) ABSTRACT

A method of manufacturing first and second substrates that are coupled together, e.g., an active and passive plate of a flat panel display. The active plate is formed according to a standard pattern and inspected. The passive plate is then formed by modifying the pattern data for the passive plate according to the actual pattern formed on the active plate to ensure that the patterns formed on the active and passive plates correspond closely.

17 Claims, 6 Drawing Sheets

U.S. PATENT DOCUMENTS

2004/0130561 A1  7/2004  Jain
2005/0007572 A1  1/2005  George et al.

FOREIGN PATENT DOCUMENTS

JP      07295229       11/1995
WO     WO 98/33096      7/1998
WO     WO 98/38597      9/1998

OTHER PUBLICATIONS

Copy of European Search Report for European Appln. 03257062.4 mailed Sep. 17, 2004, 7 pages.
English Language Abstract of JP 07295229 dated Nov. 10, 1995.
English Language Abstract of JP 03201423 dated Sep. 3, 1991.

* cited by examiner

LITHOGRAPHIC APPARATUS AND DEVICE MANUFACTURING METHOD

BACKGROUND

1. Field of the Invention

The present invention relates to a lithographic apparatus and a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (resist). Instead of a mask, the patterning means can comprise an array of individually controllable elements that generate the circuit pattern on an impinging light beam.

In general, a single substrate will contain a network of adjacent target portions that are successively exposed. Lithographic apparatus include steppers, in which each target portion is irradiated by exposing an entire pattern onto the target portion in one pass, and scanners, in which each target portion is irradiated by scanning the pattern through the beam in a given direction (the "scanning"-direction), while synchronously scanning the substrate parallel or anti-parallel to this direction.

Flat panel displays can be comprised of two plates that are manufactured separately by a lithographic process and then coupled together to form the flat panel display. For the device to function correctly, features on the two plates are precisely aligned. Even a small mismatch of the two plates can lead to light leakage or other distortion in the optical performance of the display. Such errors reduce the overall yield of the fabrication process, increasing the cost of each unit produced. In order to reduce the likelihood of light leakage, the features formed on one plate are conventionally designed to cover a larger area than necessary, providing for a margin of error. However, this typically results in aperture loss and more power being required to provide the same display intensity.

Therefore, what is needed is a manufacturing method in which the yield of a fabrication process for a device comprised of two substrates is improved without sacrificing the performance of the device produced thereby.

SUMMARY

According to one embodiment of the invention, there is provided a device manufacturing method comprising the following steps. Inspecting at least one substrate patterned according to a first pattern. Generating a second pattern in response to data generated by the inspection. Conditioning a beam of radiation using an illumination system. Using an array of individually controllable elements to impart the beam with the second pattern in its cross-section. Projecting the patterned beam of radiation onto a target portion of a second substrate. Attaching the second substrate to the at least one substrate, patterned according to the first pattern.

In one example, if the substrates are used to form a flat panel display, the patterns formed on the substrates can be formed to more closely match each other, resulting in a higher process yield without requiring a large error margin in the pattern formed on one of the substrates. Consequently, it is not necessary to use increased power to operate the resulting display at a given intensity.

In one example, in order to set the pattern for the exposure on the second substrate, the first substrate that will be attached to it can be inspected. Subsequently, the pattern exposed on each second substrate can be specifically modified for each first substrate, ensuring optimal matching between the first and second substrate when they are attached to one another.

Alternatively, to improve the throughput time of the apparatus, the devices can be formed in batches. One or more of a plurality of substrates are inspected and the results of the inspection used to set the pattern used to expose a second plurality of substrates. Substrates from the first batch are then attached to substrates from the second batch to form complete devices.

In such a batching system, substantially all of the first plurality of substrates that are exposed are inspected. The pattern for exposing the second plurality of substrates can then be generated from an average of the pattern formed on the first plurality of substrates, and any that deviate from the average by an amount that would result in a faulty device (when attached, for example, to a substrate generated using the average inspection data) are rejected.

In one example, the first substrate is formed by projecting a beam patterned according to the first pattern onto it. The beam can be patterned using an array of individually controllable elements. For instance, it can be the same array of individually controllable elements that is used to expose the first substrate.

In one example, where an array of individually controllable elements is used to pattern the first substrate, results from the inspection of substrates that have been exposed can be used to amend the pattern data used to set the array of individually controllable elements when subsequently patterning the beam. Consequently, the patterns produced on subsequent substrates patterned according to the first pattern can be improved (i.e., can be made closer to the desired pattern).

In one example, in order to amend the pattern produced on the array of individually controllable elements when patterning the beam, the pattern data corresponding to the desired pattern to be formed on the substrate can be amended in response to the inspection data, and then the amended pattern data used to generate the control signals to set the array of individually controllable elements accordingly. Alternatively, the pattern data corresponding to the desired pattern to be formed on the substrate can be used to generate control signals for setting the array of individually controllable elements; these control signals are then amended in response to the inspection data to provide the control signals that set the array of individually controllable elements.

According to one embodiment of the invention, there is provided a lithographic projection apparatus comprising an inspection system, a controller, an illumination system, an array of individually controllable elements, a substrate table, and a projection system. The inspection system inspects a substrate patterned according to a first pattern. The controller creates or amends a second pattern, in response to data generated by the inspection. The illumination system conditions a beam of radiation. The array of individually controllable elements patterns the beam according to the second pattern. The substrate table supports a second substrate. The projection system projects the patterned beam onto a target portion of the second substrate.

BRIEF DESCRIPTION OF THE DRAWINGS

Embodiments of the invention will now be described, by way of example only, with reference to the accompanying schematic drawings in which corresponding reference symbols indicate corresponding parts.

DETAILED DESCRIPTION OF THE EMBODIMENTS

Terminology

Figure 1:
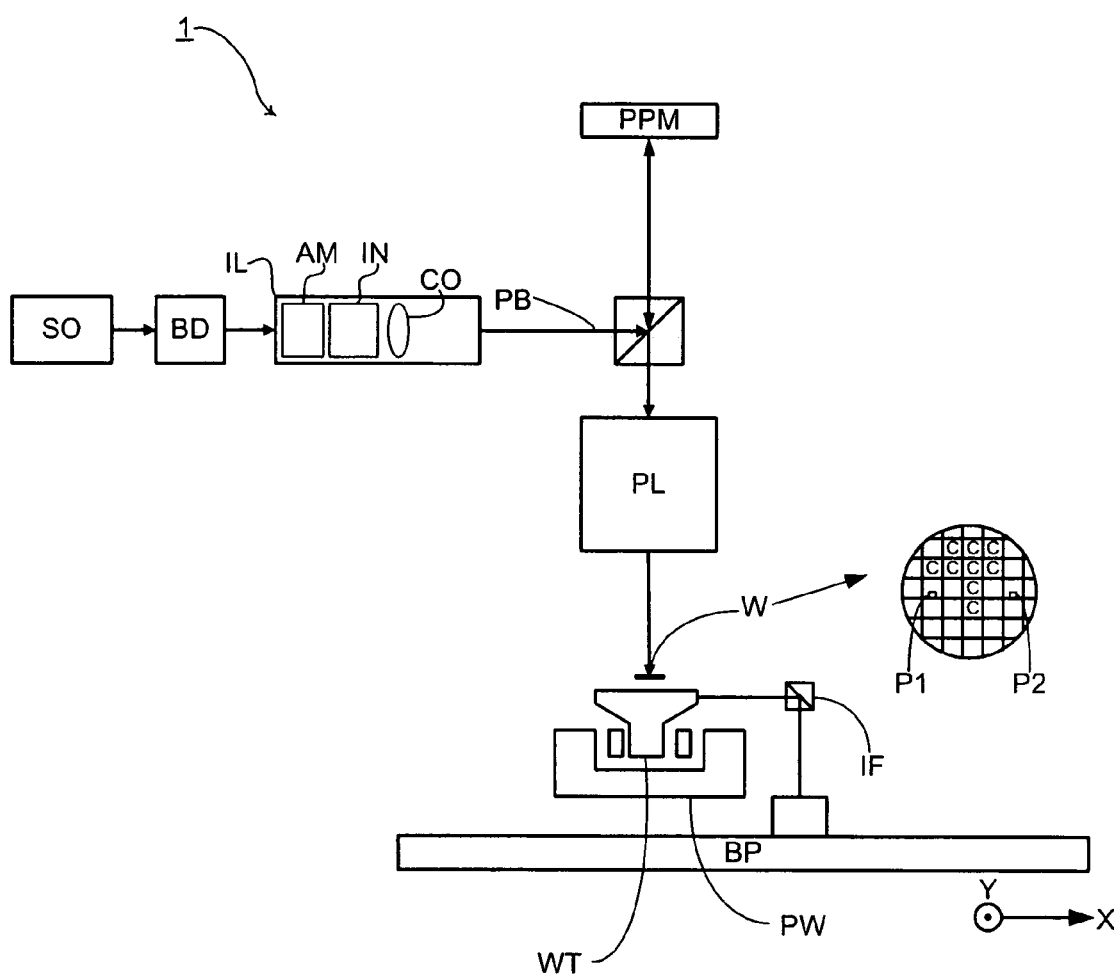
FIG. 1 depicts a lithographic apparatus, according to one embodiment of the present invention.

The term "array of individually controllable elements" as here employed should be broadly interpreted as referring to any means that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning means include, but are not limited to, a programmable mirror array and a programmable liquid crystal device (LCD) array.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors.

The matrix addressing can be performed using suitable electronic means. In the examples described above, the array of individually controllable elements can comprise one or more programmable mirror arrays. More information on mirror arrays can be found, for example, from U.S. Pat. Nos. 5,296,891 and 5,523,193, and PCT patent applications WO 98/38597 and WO 98/33096, which are incorporated herein by reference.

An example programmable LCD array is shown in U.S. Pat. No. 5,229,872, which is incorporated herein by reference.

It should be appreciated that where pre-biasing of features, optical proximity correction features, phase variation techniques, and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures, during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein can be considered as synonymous with the more general terms "substrate" or "target portion," respectively.

The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including, but not necessarily limited to, ultraviolet (UV) radiation (e.g., having a wavelength of 408, 355, 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens".

The lithographic apparatus can be of a type having two (dual stage) or more substrate tables. In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index, e.g. water, so as to fill a space between the final element of the projection system and the substrate. Immersion liquids can also be applied to other spaces in the lithographic apparatus, for example, between the array of individually controllable elements and the first element of the projection system. Immersion techniques are well known in the art for increasing the numerical aperture of projection systems.

Exemplary Environment

FIG. 1 schematically depicts a lithographic projection apparatus, according to one embodiment of the invention. The apparatus comprises an illumination system (illuminator) IL, an array of individually controllable elements PPM, a substrate table WT for supporting a substrate W, and a projection system ("lens") PL.

Illumination system (illuminator) IL provides a beam PB of radiation (e.g., UV radiation).

The array of individually controllable elements PPM (e.g., a programmable mirror array) patterns the beam. In one example, the position of the array of individually controllable elements will be fixed relative to projection system PL. In another example, it can instead be connected to a positioning means for accurately positioning it with respect to projection system PL.

As discussed above, the substrate table WT (e.g., a wafer table) supports the substrate W (e.g., a resist-coated wafer). The substrate table WT is also connected to a positioning means PW for accurately positioning the substrate with respect to projection system PL.

The projection system ("lens") PL images a pattern imparted to the beam PB by the array of individually controllable elements PPM onto a target portion C (e.g., comprising one or more dies) of the substrate W. In one example, the projection system PL can image the array of individually controllable elements PPM onto the substrate W. In anther example, the projection system PL can image secondary sources, for which the elements of the array of individually controllable elements PPM act as shutters. The projection system PL can also comprise an array of focusing elements, such as a micro lens array (known as an MLA) or a Fresnel lens array. This can be done, for example, to form the secondary sources and to image microspots onto the substrate.

In the embodiment shown, the apparatus is of a reflective type (i.e., has a reflective array of individually controllable elements). However, in general, it can also be of a transmissive type, e.g., with a transmissive array of individually controllable elements.

The illuminator IL receives a beam of radiation from a radiation source SO. In one example, the source SO and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD. In this case the beam delivery system BD includes, but is not limited to, suitable directing mirrors and/or a beam expander. In other examples the source SO can be integral part of the apparatus, for example when the source is a mercury lamp. In this example, the source SO and the illuminator IL, together with the beam delivery system BD, if required, can be referred to as a radiation system.

The illuminator IL can comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator IL can be adjusted. In some examples the illuminator IL comprises various other components, such as an integrator IN and a condenser CO. The illuminator IL provides a conditioned beam of radiation, referred to as the beam PB, having a desired uniformity and intensity distribution in its cross-section.

The beam PB subsequently interacts with the array of individually controllable elements PPM. Having been reflected by the array of individually controllable elements PPM, the beam PB passes through the projection system PL, which focuses the beam PB onto a target portion C of the substrate W.

In one example, with the aid of a positioning means PW, and possibly an interferometric measuring means IF, the substrate table WT can be moved accurately, e.g., so as to position different target portions C in the path of the beam PB.

In one example, a positioning means PW for the array of individually controllable elements PPM can be used to accurately correct the position of the array of individually controllable elements PPM with respect to the path of the beam PB, e.g., during a scan.

In one example, movement of the substrate table WT is realized with the aid of a long-stroke module (course positioning) and a short-stroke module (fine positioning), which are not explicitly depicted in FIG. 1. A similar system can also be used to position the array of individually controllable elements PPM.

It will be appreciated that the beam PB can alternatively/additionally be moveable while the substrate table WT and/or the array of individually controllable elements PPM can have a fixed position to provide the required relative movement.

As a further alternative, that can be especially applicable in the manufacture of flat panel displays, the position of the substrate table WT and the projection system PL can be fixed and the substrate W can be arranged to be moved relative to the substrate table WT. For example, the substrate table WT can be provided with a system for scanning the substrate W across it at a substantially constant velocity.

Although the lithography apparatus of the invention is herein described as being for exposing a resist on a substrate, it will be appreciated that the invention is not limited to this use and the apparatus can be used to project a patterned beam for use in resistless lithography.

The depicted apparatus can be used in four one modes: a step mode, a scan mode, a pulse mode, and a continuous scan mode.

In a Step mode, the array of individually controllable elements PPM imparts an entire pattern to the beam PB, which is projected onto a target portion C in one pass (i.e., a single static exposure). The substrate table WT is then shifted in the X and/or Y direction, so that a different target portion C can be exposed. In step mode, the maximum size of the exposure field limits the size of the target portion C imaged in a single static exposure.

In Scan mode, the array of individually controllable elements PPM is movable in a given direction (e.g., a "scan direction" or a Y direction) with a speed v, so that the beam PB is caused to scan over the array of individually controllable elements PPM. Concurrently, the substrate table WT is substantially simultaneously moved in the same or opposite direction at a speed V=Mv, in which M is the magnification of the lens PL. In scan mode, the maximum size of the exposure field limits the width (in the non-scanning direction) of the target portion C in a single dynamic exposure, whereas the length of the scanning motion determines the height (in the scanning direction) of the target portion C.

In Pulse mode, the array of individually controllable elements PPM is kept essentially stationary and the entire pattern is projected onto a target portion C of the substrate W using a pulsed radiation system. The substrate table WT is moved with an essentially constant speed, such that the beam PB is caused to scan a line across the substrate W. The pattern on the array of individually controllable elements PPM is updated as required between pulses of the radiation system. The pulses are timed such that successive target portions C are exposed at the required locations on the substrate W. Consequently, the beam PB scans across the substrate W to expose the complete pattern for a strip of the substrate W. The process is repeated until the complete substrate W has been exposed line by line.

Continuous scan mode is essentially the same as pulse mode except that a substantially constant radiation source is used and the pattern on the array of individually controllable elements PM is updated as the beam PB scans across the substrate W and exposes it.

Combinations and/or variations on the above described modes of use or entirely different modes of use can also be employed.

Exemplary Operations

The following is one embodiment of the invention, which is described in terms of the formation of an active plate and a passive plate that are assembled to form a flat panel display. For example, these can be the TFT plate and the color filter plate, respectively, of an Active-Matrix LCD (AM-LCD) display. However, it will be appreciated that, in general, the invention can be used to form any device formed by assembling together two substrates on which corresponding patterns have been formed. For example, the invention can be used to form passive LCDs, plasma displays, Organic Light Emitting Diodes (OLED) displays, Polymer Light Emitting Diodes (PLED) displays, Low Temperature PolySilicon (LTPS) displays, Field Emission Displays (FEDs), Vacuum Fluorescence Displays (VFDs), or the like. This list is meant to be exemplary, but not exhaustive.

Figure 2:
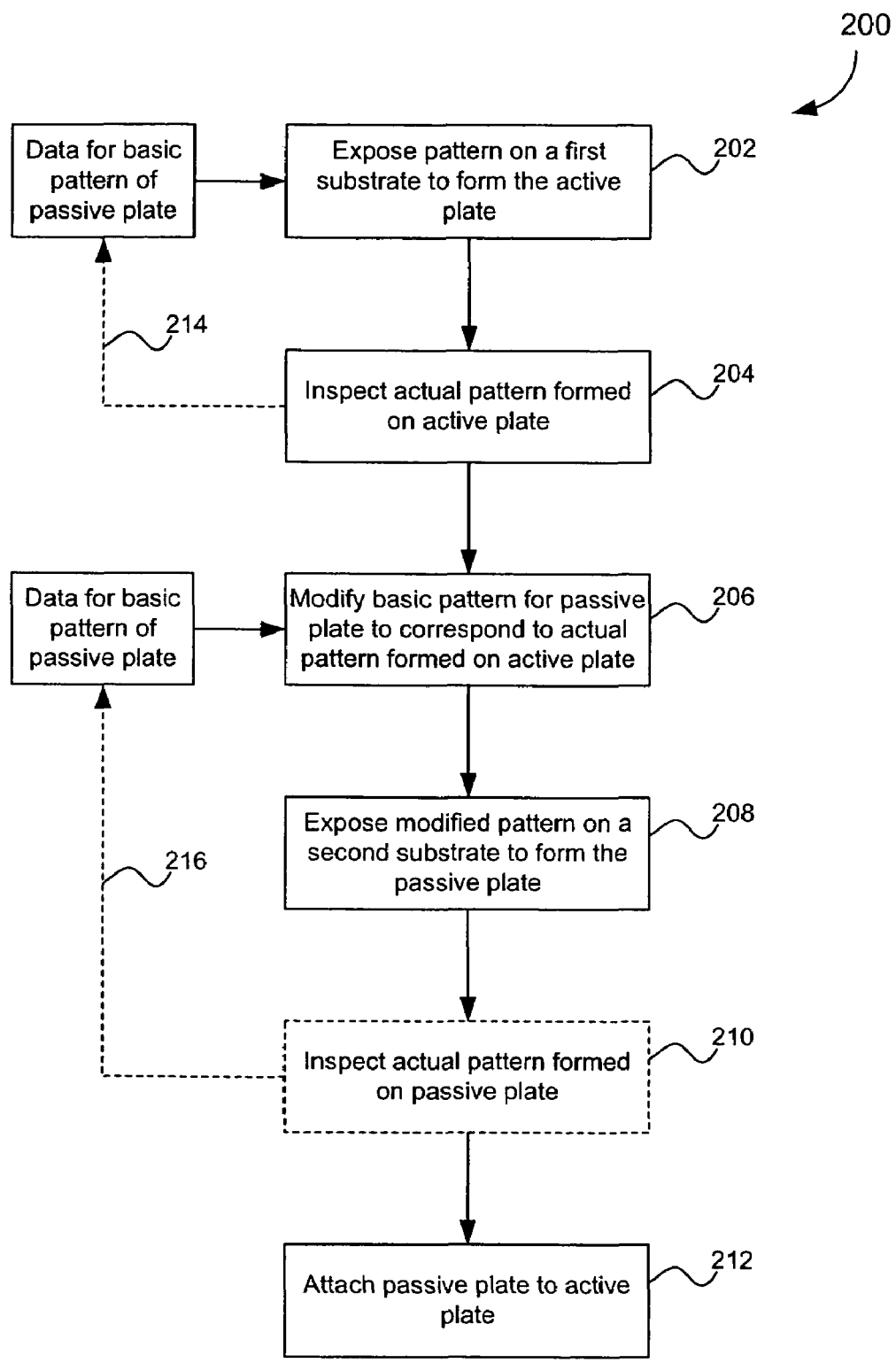
FIGS. 2, 3, and 4 depict flowcharts representing methods, according to various embodiments of the present invention.

FIG. 2 represents a device manufacturing method 200, according to one embodiment of the present invention. In step 202, a pattern is exposed on a first substrate to form an active plate of a first device. In step 204, the pattern is inspected to identify the actual positions and dimensions of the pattern features that have been formed on the active plate. For example, the can be done by inspecting the entire pattern formed on the active plate, inspecting a sample of the features formed on the active plate, by inspecting features that are formed on the active plate specifically for inspection and do not have an active function in the performance of the final device, or through other methods.

In step 206, data from the inspection of the active plate is used to modify the basic pattern data to be used to form the passive plate. Consequently, the pattern formed on the passive plate corresponds more closely to the pattern formed on the active plate. For example, this can done by adjustment of the feature sizes formed on the passive plate (e.g., by adjusting the magnification), adjustment of the positioning of the features to be formed on the passive plate, both relative to each other and their absolute position relative to the plate, adjustment of the shape of the features, or through other methods. Consequently, it is possible to compensate for substrate expansion (e.g., thermal expansion, which can not be uniform across the substrate due to variations within the substrate) and/or deformation during processing. This is especially useful if the substrate is formed from a material more prone to such problems than conventional substrates, for example substrates made of plastic.

In one example, where a display is to be formed, the inspection can be used to detect faults in the active plate that will result in faulty pixels and the pattern for the passive plate can be modified accordingly. For example, a permanently OFF (black) pixel is less obtrusive than a permanently ON (bright) or flashing pixel. Therefore, if such a potential fault is detected in a feature of the active plate, the pattern for the passive plate can be amended to delete or change the corresponding feature on the passive plate to produce a permanently off pixel.

In step 208, once the pattern data for the passive plate has been modified, it is used to expose the pattern on a second substrate to form the passive plate. In one example, this is effected using an array of individually controllable elements, as discussed above.

The modification of the pattern set on the array of individually controllable elements can be performed by modifying the pattern data before it is converted into control signals for setting the array of individually controllable elements. Alternatively and/or additionally, the pattern formed on the array of individually controllable elements can be modified by directly adjusting the control signals that are used to set the array of individually controllable elements.

The patterning means used to form the active plate can also be an array of individually controllable elements. In this case, the result of the inspection of the actual pattern formed on the active plate can be used to amend the data used to form the pattern of the active plate such that, when subsequent active plates are formed, the actual pattern formed on the active plate corresponds more closely to the pattern as designed.

In optional step 210, once the pattern has been formed on the passive plate, it can also be inspected to confirm that the actual pattern formed on the passive plate is within the required tolerances. As before, this inspection can be used to amend the data for the basic pattern to be formed on the passive plate (although it will, of course, need to take account of any modifications that were applied to the basic pattern for the inspected passive plate when it was formed).

In one example, the substrate can be inspected with an inspection system prior to either pattern being exposed on the substrate. For example, the inspection system can inspect alignment marks formed on the substrate or device features that have already been formed. Using the information from the inspection system, the pattern to be formed on the substrate can be further modified to take account of, for example, thermal expansion (including local variations) and/or deformations of that substrate.

In one example, a lithographic apparatus includes an inspection system adjacent to the exposure unit, such that each part of the substrate can be inspected immediately prior to it being exposed, allowing the pattern to be modified for any deformations in the substrate caused by the exposure process.

In step 212, once the corresponding patterns have been formed on the active and the passive plates, they can be attached together to form a flat panel display device.

In optional steps 214 and/or 216, data from the inspections can be used to modify the data for the basic pattern of the active or passive plate, respectively.

Figure 3:
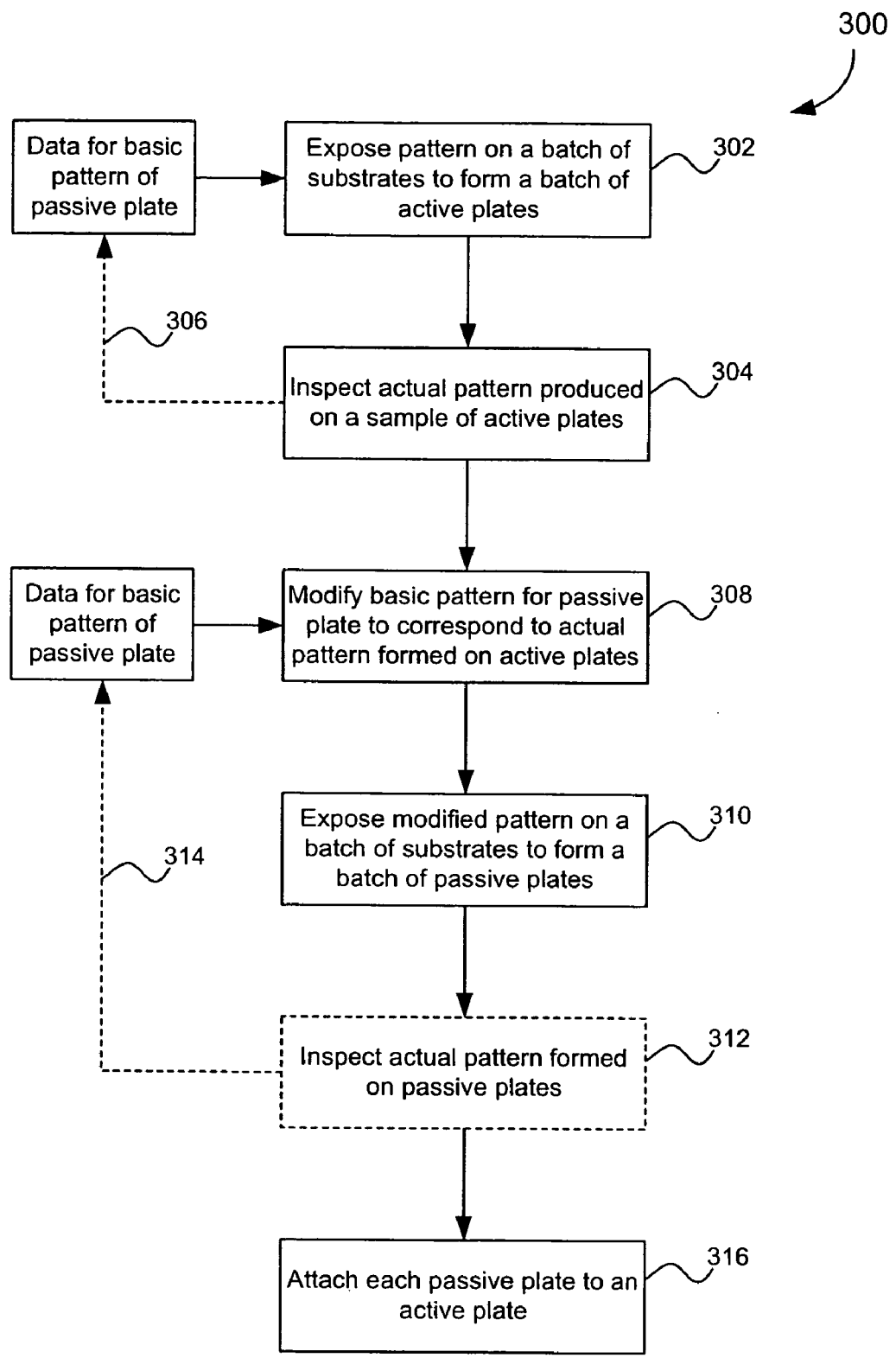

FIG. 3 shows a flowchart depicting a method 300, according to one embodiment of the present invention. In this case, a batch of several substrates are exposed to form a plurality of active plates. In step 302, a pattern is exposed on a batch of substrates to form a back of active plates. In step 304, an actual pattern produced on a sample of the active plates is inspected. In optional step 306, this inspection is used to modify the data for the basic pattern of the active plates. In step 308, the basic pattern for the passive plate is modified to correspond to the actual pattern formed on the active plate. In step 310, the modified pattern is exposed onto a batch of substrate to form a batch of passive plates. In optional step 312, an actual pattern formed on the passive plates is inspected. In optional step 314, the actual pattern is used to modify the data for the basic pattern of the passive plate. In step 316, each passive plate is attached to a respective one of the active plates.

Figure 4:
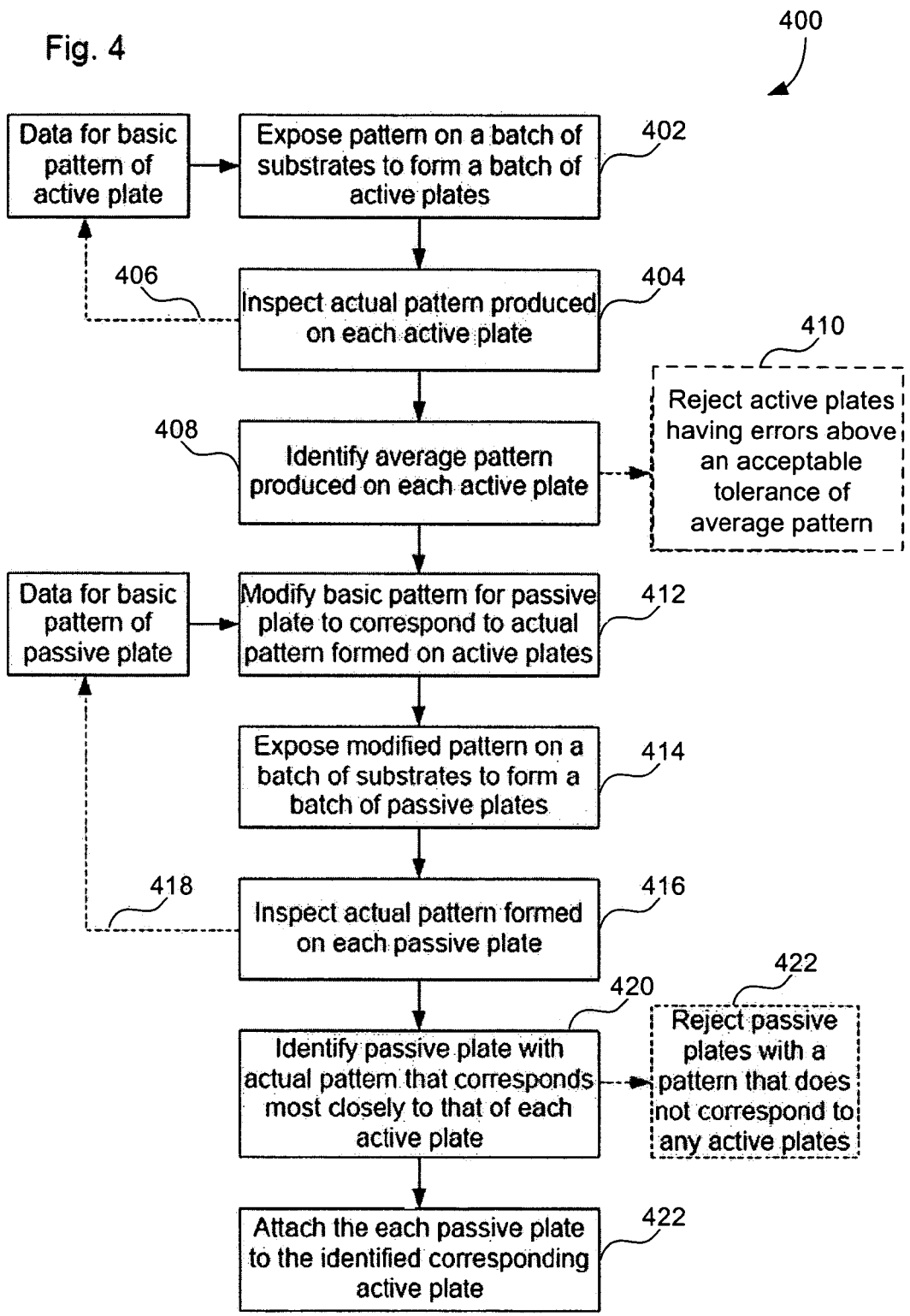

FIG. 4 show a flowchart depicting a method 400, according to one embodiment of the present invention. In step 402, a batch of substrates are exposed to form active plates. In step 404, each of the active plates produced is inspected. In optional step 406, this data is used to modify the data for the basic pattern of the active plates. In step 408, an average of the patterns produced on the active plates is then determined. In optional step 410, active plates have errors about an acceptable tolerance of the average pattern are rejection. In step 412, the pattern for the passive plates is modified to correspond to the average pattern on the active plate. In step 414, A batch of passive plates are then formed using this modified pattern. In step 416, each passive plate is then inspected to identify the actual pattern formed on each passive plate. In optional step 418, this data is used to modify the data for the basic pattern of the passive plates. In step 420, a passive plate is identified for each active plate, such that the actual patterns formed on each pair of active and passive plates correspond most closely to each other. In optional step 422, passive plates with a pattern that does not correspond to any active plates are rejected. In step 424, each passive plate is attached to the identified corresponding active plate.

As discussed above, in one example, once the batch of active plates has been inspected, those active plates that are beyond an acceptable tolerance of the average pattern can be rejected. In this case, the average pattern can be recalculated not taking into account the rejected pattern(s). Similarly, once the batch of passive plates have been inspected, those passive plates with a pattern that does not correspond sufficiently closely to any of the active plates can be rejected.

Although the methods described above all refer to the active plate being formed first and the passive plate being formed subsequently, with the pattern data for the passive plate being modified to correspond to the actual pattern produced on the active plate, it will be appreciated that this method can also be reversed. Thus, in one example, the passive plate can be formed first and the pattern data for the active plates modified to form active plates that correspond to the actual pattern formed on the passive plates.

In one example, one of the plates can be pre-formed (and, for example, bought in from a third party) and then inspected prior to the formation of a plate or batch of plates for attaching to the preformed plate(s).

It will also be appreciated that elements of the variant methods described above can be combined together. For example, where the method shown in FIG. 4 is being used and an active or a passive plate is rejected, a corresponding passive or active plate, respectively, can be formed specifically for the rejected plate in a manner corresponding to that of the method shown in FIG. 2.

Exemplary System for Making Flat Panel Displays

Figure 5:
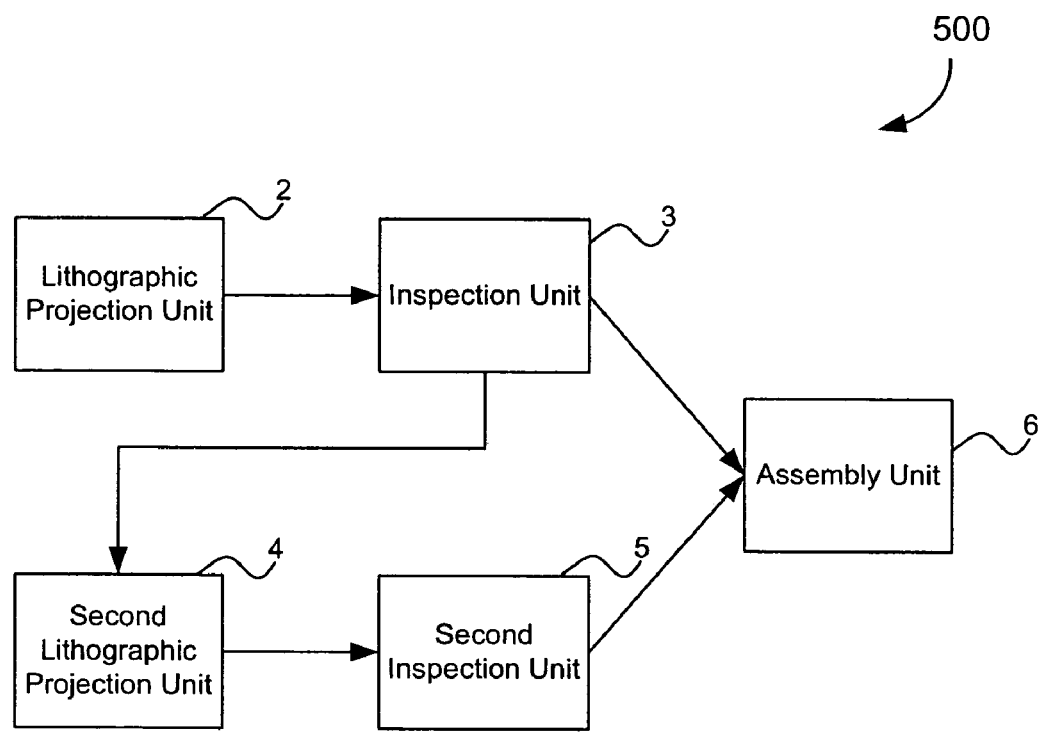
FIGS. 5 and 6 depict schematic layouts of apparatus that can be used, according to various embodiments of the present invention.
Figure 6:
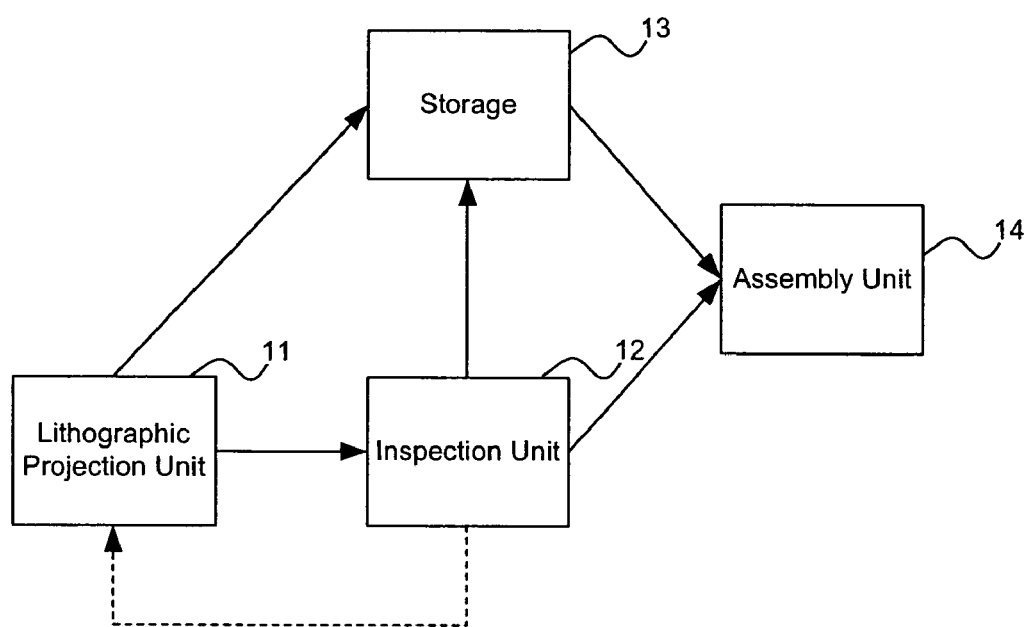

FIG. 5 depicts a system 500, according to one embodiment of the present invention. For example, system 500 can be used to perform one or more of the operations shown in FIGS. 2, 3, and/or 4. System 500 includes a first lithographic projection unit 2, a first inspection unit 3, a second lithographic projection unit 4, a second inspection unit 5, and an assembly unit 6.

In one example, an active plate is formed in lithographic projection unit 2 and transferred to inspection unit 3. In inspection unit 3, the actual pattern produced on the active plate is inspected. This data is transferred to second lithographic projection unit 4, in which a passive plate is formed by modifying the pattern data for the passive plate using the data from inspection unit 3. The passive plate formed in second lithographic projection unit 4 is transferred to second inspection unit 5, in which the actual pattern formed on the passive plate is inspected, if necessary. Subsequently, the active plate from inspection unit 3 and the passive plate from inspection unit 5 are transferred to assembly unit 6, in which they are attached together.

It is to be appreciate that storage units (not shown) for holding patterned plates, associated with inspection units 3,5 and/or lithographic projection units 2,4, can be provided, allowing system 500 to perform the batch production methods, for example as described above with respect to FIGS. 3 and 4.

Figure shows a system 600, according to one embodiment of the present invention. For example, system 600 can be used to perform one or more of the methods discussed above with respect to FIGS. 2, 3, and 4. System 600 includes a lithographic projection unit 11, a inspection unit 12, a storage unit 13, and an assembly unit 14.

In one example, an active plate formed in lithographic projection unit 11 is transferred to inspection unit 12. When performing the method of the present invention as described above with reference to FIG. 2, the active plate can be transferred after inspection to storage unit 13 or can be transferred directly to the assembly unit 14. The data from the inspection of the active plate is then fed back to lithographic projection unit 11 for the formation of the passive plate. The passive plate can then be transferred to assembly unit 14 for attachment to the active plate (e.g., by way of inspection unit 12 if inspection of the passive plate is required). When performing the batch production methods as described above with reference to FIGS. 3 and 4, the active and passive plates formed in lithographic projection unit 11 are stored after exposure in storage unit 13 until required for assembly to a corresponding passive or active plate. The plates can be transferred via inspection unit 12, if inspection is required, or directly from the lithographic projection unit.

It will be appreciated that there need not be a separate inspection unit. For example, inspection can take place while a substrate is within the lithographic projection unit or during transport. Furthermore, the inspection can take place in real time. For example, one part of a substrate can be inspected, while another part is being exposed. Similarly, exposure of a second substrate, with a pattern that is amended in response to the inspection of the actual pattern on a first substrate, can take place as the first substrate is being inspected.

CONCLUSION

While specific embodiments of the invention have been described above, it will be appreciated that the invention can be practiced otherwise than as described. The description is not intended to limit the invention.

What is claimed is:

1. A device manufacturing method, comprising:
   (a) inspecting for a fault found in a pattern formed on a first substrate, which was patterned according to a first pattern;
   (b) creating or modifying a second pattern that compensates for the fault in the pattern formed on the first substrate in response to the inspected pattern;
   (c) patterning a second substrate using the second pattern; and
   (d) coupling the second substrate to the first substrate.

2. The method of claim 1, wherein the patterning in at least one of steps (a) and comprises:
   patterning a beam of radiation with the respective first or second pattern; and
   projecting the patterned beam onto a target portion of the respective first or second substrate.

3. The method of claim 2, further comprising using an array of individually controllable elements to perform the patterning.

4. The method of claim 3, wherein pattern data used to control the array of individually controllable elements for patterning the beam according to the respective first or second pattern is modified in response to data generated by the inspection step (a), the modified pattern data being used when beams, patterned according to the respective first or second patterns, are subsequently projected onto the respective first or second substrates.

5. The method of claim 1, wherein:
   the first substrate is used to form a color filter plate of a flat panel display; and
   the second substrate is used to form an active plate of the flat panel display.

6. The method of claim 1, wherein step (b) comprises modifying a design pattern of features to be exposed on the second substrate through performing at least one of:
   adjusting a size of features to be exposed on the second substrate; and
   adjusting a separation of features to be exposed on the substrate.

7. The method of claim 1, wherein the first and second patterns correspond to features of the device at least partially formed when the second substrate is attached to the first substrate.

8. The method of claim 1, further comprising:
   providing an active plate as the first substrate, wherein the fault comprises a faulty pixel on the active plate; and
   providing a passive plate as the second substrate, wherein the second pattern is used to form a feature on the passive plate that compensates for the faulty pixel on the active plate.

9. The method of claim 1, further comprising:
   providing a passive plate as the first substrate, wherein the fault comprises a faulty area on the passive plate; and
   providing an active plate as the second substrate, wherein the second pattern is used to form a feature on the active plate that compensates for the faulty area on the passive plate.

10. A device manufacturing method, comprising:
    (a) inspecting respective patterns formed on a plurality of first substrates that are patterned according to a first pattern to determine an average pattern;
    (b) generating or modifying a second pattern in response to the average pattern generated by the inspection;
    (c) patterning respective beams of radiation based on the second pattern;
    (d) projecting the respective patterned beams of radiation onto corresponding ones of a plurality of second substrates; and
    (e) coupling each of the plurality of first substrates to a respective one of the plurality of second substrates.

11. The method of claim 10, wherein the step (a) further comprises:
    comparing respective ones of the inspected patterns of each respective one of the plurality of first substrates against an acceptable tolerance; and
    rejecting respective ones of the plurality of first substrates whose respective inspected patterns are above the acceptable tolerance.

12. The method of claim 11, wherein step (b) further comprises eliminating data corresponding to the rejected ones of the plurality of first substrates from the average pattern.

13. A lithographic apparatus, comprising:
    an inspection system that inspects for a fault in a pattern formed on a first substrate patterned according to a first pattern;
    a controller that creates or modifies a second pattern to compensate for the fault, in response to data generated by the inspection system;
    an array of individually controllable elements that pattern a beam according to the second pattern;
    a projection system that projects the patterned beam onto a target portion of a second substrate; and
    an assembly system that couples together the first and second substrates.

14. The lithographic apparatus of claim 13, wherein
    a plurality of the first and second substrates are used; and
    the assembly system forms a plurality of respective pairs of coupled together ones of the first and second substrates.

15. The lithographic apparatus of claim 13, wherein:
    the first substrate comprises an active plate, wherein the fault comprises a faulty pixel on the active plate; and
    the second substrate comprises a passive plate, wherein the second pattern is used to form a feature on the passive plate that compensates for the faulty pixel on the active plate.

16. The lithographic apparatus of claim 13, wherein:
    the first substrate comprises a passive plate, wherein the fault comprises a faulty area on the passive plate; and
    the second substrate comprises an active plate, wherein the second pattern is used to form a feature on the active plate that compensates for the faulty area on the passive plate.

17. The lithographic apparatus of claim 14, wherein the inspection system is configured to:
    compare respective ones of the inspected patterns of each respective one of the plurality of first substrates against an acceptable tolerance; and
    reject respective ones of the plurality of first substrates whose respective inspected patterns are above the acceptable tolerance.

* * * * *